(12) United States Patent
Mattia

(10) Patent No.: US 6,278,105 B1
(45) Date of Patent: Aug. 21, 2001

(54) TRANSISTOR UTILIZING PHOTONIC BAND-GAP MATERIAL AND INTEGRATED CIRCUIT DEVICES COMPRISING SAME

(75) Inventor: John Paul Mattia, Basking Ridge, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/236,763

(22) Filed: Jan. 25, 1999

(51) Int. Cl.[7] ............................. H01L 31/00; G02F 1/00
(52) U.S. Cl. .................. 250/214.1; 359/245; 359/237; 359/321; 359/322; 359/326; 359/332; 343/786
(58) Field of Search ................... 250/214.1; 359/245, 359/237, 247, 321, 322, 299, 332, 326; 343/786, 772

(56) References Cited

U.S. PATENT DOCUMENTS

| | | | |
|---|---|---|---|
| 5,689,275 | * 11/1997 | Moore et al. | 343/786 |
| 5,973,823 | * 10/1999 | Koops et al. | 359/322 |
| 5,999,308 | * 12/1999 | Nelson et al. | 359/321 |
| 6,064,506 | * 5/2000 | Koops | 359/237 |
| 6,064,511 | * 5/2000 | Fortmann et al. | 359/321 |

* cited by examiner

Primary Examiner—Loha Ben
(74) Attorney, Agent, or Firm—Mathews, Collins, Shepherd & Gould, P.A.

(57) ABSTRACT

A tunable photonic band-gap device is disclosed which utilizes photoresponsive materials and is tunable over a range of wavelengths with the application of light. The device comprises a structure having a plurality of photoresponsive regions arranged in a matrix whereby the behavior of the device in preventing electromagnetic radiation from propagating through the structure may be modified by applying light to the photoresponsive regions. In one embodiment, a photonic band-gap transistor has a light propagation path defined by a plurality of dielectric and photoresponsive rods disposed in a substrate for the routing of a signal through the structure from an inlet to an outlet. The path comprises an input signal path beginning at the inlet, an output signal path terminating at the outlet, and a control signal path which merges with the input signal path to be joined with the output signal path at a common intersection point. In this embodiment, photoresponsive rods are disposed at the common intersection point so that a control signal may be selectively passed to the photoresponsive rods to alter the optical properties of the photoresponsive rods and thereby tune the output signal generated by the device at the outlet.

19 Claims, 4 Drawing Sheets

TRANSISTOR UTILIZING PHOTONIC BAND-GAP MATERIAL AND INTEGRATED CIRCUIT DEVICES COMPRISING SAME

FIELD OF THE INVENTION

The present invention relates to a device comprising a transistor which utilizes a photonic band-gap material comprising photoresponsive elements tunable with the application of light. The invention further relates to semiconductor and integrated circuit devices comprising the inventive transistor.

BACKGROUND OF THE INVENTION

Transistors are dominant and important devices in fabricating integrated circuits. They may be used for amplifying, switching, and detecting signals and typically contain at least two rectifying junctions connected to metallic contacts. Characteristically transistors operate so the current between one pair of terminals controls the current between the other pair, one terminal being common to output and input. The operation and fabrication of many types of transistors are well known and described in numerous references including S. M. Sze, SEMICONDUCTOR DEVICES (1985), which is incorporated herein by reference. Generally, transistors are made from electrically-conducting materials, such as metals and substrates doped with phosphorous, arsenic, or boron to form p and n-type carrier regions, and they are electronically operated, i.e., they operate based on the electrical properties of the materials.

A photonic band-gap (PBG) material has the property of preventing electromagnetic radiation having some discrete wavelength or range of wavelengths from propagating within the material. The photonic band-gap has been formed by creating a periodicity in a material's dielectric properties in two or three dimensions. This may be accomplished with use of an array of holes or cavities in layers of dielectric materials so there is a two or three dimensional change in the dielectric properties of the materials.

For example, FIG. 1 shows a perspective view of a prior art PBG material that is periodic in two dimensions, that is, it has a repeated two-dimensional change in dielectric composition. The PBG material 10 is comprised of a first material 11 having a first dielectric composition or permittivity $\epsilon_1$ in which is disposed a plurality of cylindrical elements 12a, 12b, 12c, etc., each of which is comprised of a second material having a second dielectric composition or permittivity $\epsilon_2$ relative to the first material. The cylindrical elements may be filled with gasses or fluids or they may be left hollow to define voids. Periodicity is established along the x-z plane due to differences in the dielectric properties of the materials such that electromagnetic energy within the range of a band-gap and polarized along the longitudinal axes of the elements 12a, 12b, 12c, etc. is substantially prevented from propagating through the material 10. The material is most effective for blocking electromagnetic radiation propagating along any incident angle of the x-z plane.

Many PBG devices have operated in the microwave region of the electromagnetic spectrum and thus have had limited utility. New materials and processes for use in forming the photonic band-gap material are being developed so that they may operate across a wider range of wavelengths to expand potential uses for the devices. For example, U.S. Pat. No. 5,385,114 and U.S. Pat. No. , 5,688,319 issued Jan. 31, 1995 and Nov. 18, 1997, respectively, both to Milstein et al. and titled "Photonic Band-Gap Materials and Method of Preparation Thereof" (both incorporated herein by reference), describe use of a sapphire band-gap material in single crystal form which is designed to expand the range of wavelengths controlled from the millimeter or microwave region to the ultraviolet region. An antenna using PBG materials is disclosed in U.S. Pat. No. 5,689,275 issued Nov. 18, 1997, to Moore et al. "Electromagnetic Antenna Transmission Line Utilizing Photonic Band-Gap Material" ("Moore").

Another difficulty relating to PBG devices, which limits the potential uses for these devices, involves tuning them to operate at specific wavelengths. For example, in Moore, dielectric material is used to fabricate the photonic band-gap antenna, and to vary the frequency at which the photonic band-gap appears, cooling liquid is circulated within the periodically placed voids. The Milstein '114 and '319 patents describe that PBG devices may be tuned to operate within distinct portions of the spectrum by modifying the physical dimensions of the material forming the device, by modifying the voids, by infiltrating liquid or solid materials in the voids, or by applying mechanical pressure on the surface of the material to thereby modify the relative dimensions of the voids and solid portions (e.g., altering the dimensions of the cylindrical rods). Milstein '114 and '319 teach that PBG devices may be tuned by deliberating changing the device dimensions, e.g., with electrostriction or magnetostriction. However, there are limits to the extent of tuning that may be performed with these approaches, because changing the dimensions in a way sufficient to achieve more expansive tuning could threaten the structural integrity of the device.

Those concerned with semiconductor devices and technologies continually search for new components and designs, e.g., devices that are tunable, operable at higher speeds, use less power, and have less complicated parts. The instant invention provides a photonic band-gap device that may be utilized as a transistor to offer advantages over electronically-operated transistors as it operates over a wide range of wavelengths and is tunable with the application of light. The transistor is particularly useful for forming arrays of devices to perform computational functions.

SUMMARY OF THE INVENTION

Summarily described, the invention embraces a photonic band-gap device comprising a structure having disposed therein a plurality of photoresponsive periodic regions arranged in a matrix whereby the behavior of the device in preventing electromagnetic radiation from propagating therethrough may be modified by applying light to the photoresponsive regions. In one embodiment, the device comprises a photonic transistor having a light propagation path defined therein by a plurality of dielectric and photoresponsive rods for the routing of a signal through the structure from an inlet to an outlet. The path comprises an input signal path beginning at the inlet, an output signal path terminating at the outlet, and a control signal path which merges with the input signal path to be joined with the output signal path at a common intersection point. The photoresponsive rods are disposed at the intersection point so that a control signal may be selectively passed through the control signal path to the photoresponsive rods to alter the optical properties of the photoresponsive rods, thereby tuning the signal generated by the device at the outlet. In another embodiment, a plurality of the photonic transistors are arranged in an array to fabricate an integrated circuit device.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

With this invention, a photonic band-gap device that may comprise a tunable photonic transistor is provided. The photonic band-gap device comprises a structure, such as a semiconductor wafer or substrate, that has a two or three-dimensional matrix defined therein by a plurality of photoresponsive periodic regions. The term "photoresponsive region" as used herein means a region comprised of photoresponsive material, i.e., a material whose properties will change upon the application of light such that when a light beam is applied through the material, there is a change in the wavelengths excluded by the device. In other words, the applied light beam modifies the optical properties of the photoresponsive material and thereby changes the properties of the band gap. Photoresponsive materials may include photorefractive or photoabsorptive materials. Exemplary suitable materials include compounds, alloys or systems formed from elements in columns III and V of the periodic table. The inventive PBG device is advantageous in that light beams may be used to tune the device. The propagation of discrete wavelengths of light through the device may be controlled without physically changing or distorting the dimensions of the device and without having to use a complicated structure or array.

One approach for forming the matrix of photoresponsive periodic regions is to drill holes in a substrate and then fill select holes with materials having a different photoresponsivity or dielectric constant. In other words, a portion of the holes can be filled with photoresponsive material (to provide photoresponsive rods), and other holes can either be left empty or filled with materials having a certain dielectric constant different from that of the substrate (to provide voids or dielectric rods). Other approaches for forming the matrix of photoresponsive regions are contemplated such as, for example, creating a gradient of photoresponsive and dielectric regions as the substrate is formed. It should be understood that the references to holes and rods herein is exemplary and not limiting.

Figure 1:
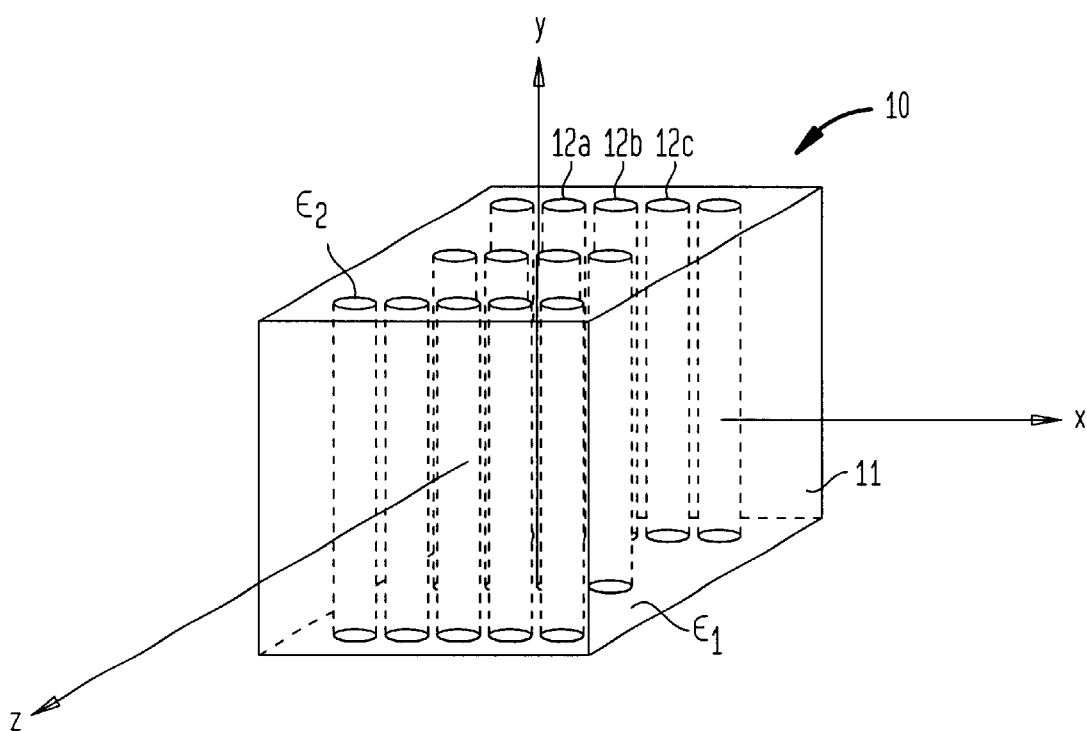
FIG. 1 is a perspective view of a prior art photonic band-gap device.
Figure 2:
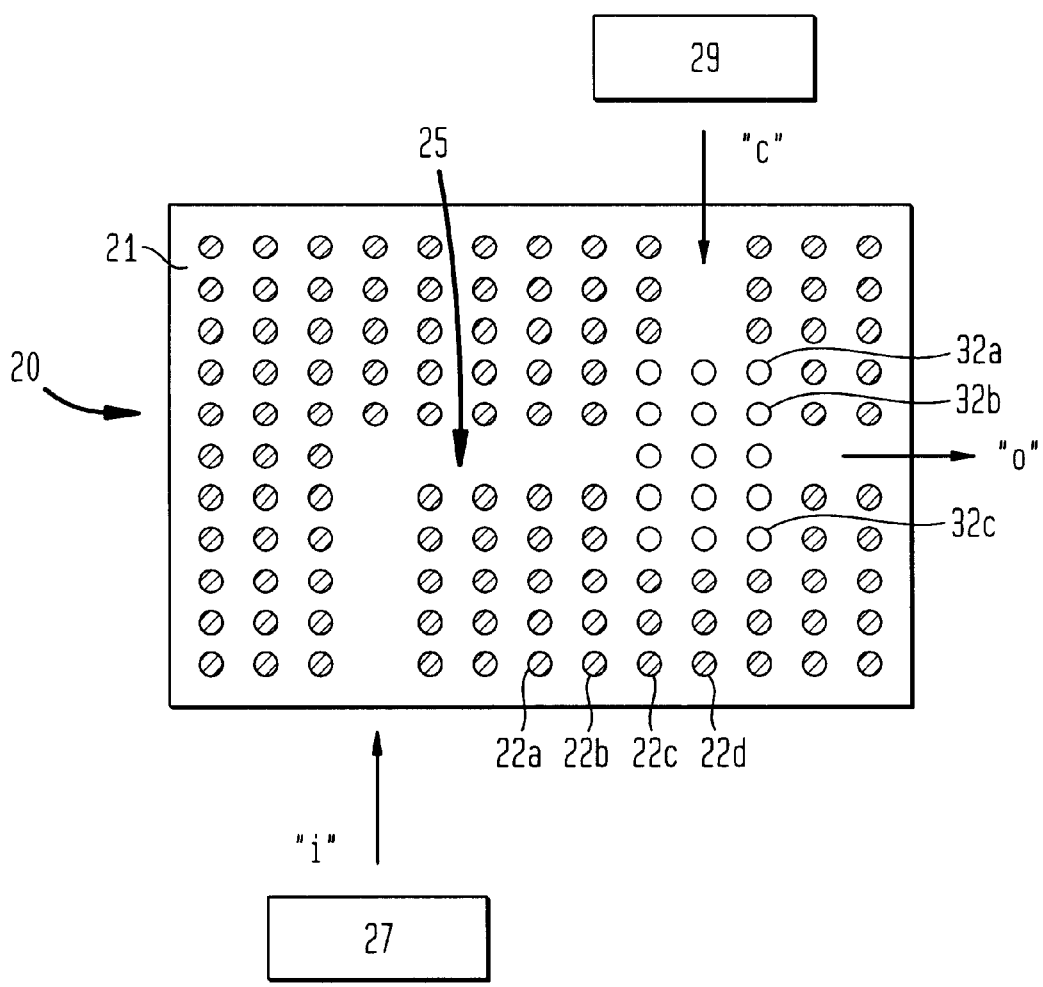
FIG. 2 is a schematic cross-sectional view of a two-dimensional photonic band-gap transistor.

A light propagation path may be defined in a PBG device by using the matrix of photoresponsive regions. To illustrate, FIG. 2 shows one embodiment of the invention reflecting a cross-sectional view of a two-dimensional photonic band-gap device 20 comprising a single-transistor. The device 20 includes a substrate 21 which may comprise a semiconductor wafer. The matrix of this PBG includes photoresponsive regions. A plurality of cylindrical rods are defined in the substrate, and certain selected rods are fabricated with a material having a first dielectric composition, 22a, 22b, 22c, 22d etc. (shown with hatching). Other rods, 32a, 32b, 32c, etc., are fabricated with a photoresponsive material (shown in white). The dielectric rods (22a, 22b, 22c, 22d etc.), and photoresponsive rods (32a, 32b, 32c, etc.), may be formed by etching or drilling holes in the substrate 12 and then filling the holes with materials having photoresponsivity or a dielectric constant different from that of the substrate. A light propagation path 25 is defined in the device, i.e., along arrows "i", "c", and "o", by voids between the dielectric rods or differences in the dielectric constants of the materials forming the dielectric rods. For example, holes for forming the rods are etched in the substrate 21, and to define the light propagation path, there may be a predetermined path 25 along which essentially no holes are etched. Alternatively, holes for forming the rods may be drilled or etched in the wafer across its surface, i.e., over its length and width. In that case, the light propagation path may be defined by leaving the rods along a certain section substantially empty or by filling certain of the rods with a material having a dielectric constant different from that of other dielectric rods. For example, certain of the rods may be filled with a dielectric constant that is substantially the same as the dielectric constant of the substrate, while other rods may be filled with a dielectric constant that is different than the dielectric constant of the substrate. As can be seen, a percentage of holes may be etched and filled along the light propagation path (i.e., they are not necessarily left completely empty), e.g, the photoresponsive rods 32a, 32b, 32c are placed along the light propagation path.

A semiconductor wafer may be used to define the substrate. In forming the holes, photolithography or electron-beam lithography may be applied to define the regions on the wafer to be etched. Processes for photolithography and electron-beam lithography are known. A lithography process that may be applied which allows for high resolution patterning comprises Scattering with Angular Limitation in Projection Electron-beam Lithography (known as "SCALPEL"), described in U.S. Pat. No. 5,260,151, "Device Manufacture Involving Step-and-Scan Delineation," issued Nov. 9, 1993 to Berger et al, assigned to Lucent Technologies, Inc. (the present assignee), incorporated by reference. For background on other lithography systems, see U.S. Pat. No. 5,602,619, "Scanner for Step and Scan Lithography System," issued Feb. 11, 1997 to Sogard, assigned to Nikon Precision, Inc., and U.S. Pat. No. 5,674,413, and "Scattering Reticlefor Electron Beam Systems," issued Nov. 12, 1995 to Pfeiffer et al, assigned to IBM Corp.

Once a pattern for the holes is defined and the holes are etched in the defined regions, select holes may be filled with materials having different dielectric constants (e.g., dielectric constants different from that of the material forming the wafer). Illustrative dielectric materials may include, for example, materials containing silicon dioxide ($SiO_2$), or other silicon-oxides ($SiO_x$) or nitrides ($SiN_x$), or titanium-based materials such as titanium-oxide ($TiO_2$). Other materials and systems useful as dielectrics are known and are also being developed, and the invention is not limited to use of any particular dielectrics. Other select rods may be filled with photoresponsive materials, e.g., photoabsorptive or photorefractive materials as described above. Also, the photoresponsive rods may contain quantum well regions. Molecular beam epitaxy may be applied to create a potential well from the surface of the substrate 21 to define quantum well regions for forming the photoresponsive rods.

In the embodiment of FIG. 2, which illustrates a transistor, the light propagation path can be described as having three parts, e.g., an input signal path following arrow "i", a control signal path following arrow "c", and an output signal path preceding arrow "o." Light sources shown schematically at boxed regions 27, 29 are provided for introducing light beams into the input and control signal paths. The input and control signal paths merge at a common intersection point to be joined with the output signal path. The photoresponsive rods 32a, 32b, 32c, etc., are disposed within the light propagation path at the common intersection point. In this way, as the input signal "i" is passed through the device, the control signal "c" may be selectively passed through the rods 32a, 32b, 32c, to alter their optical properties and thereby tune the output signal "o" generated by the device. Accordingly, the PBG device of this invention can be tuned to operate within distinct portions of the electromagnetic spectrum with the application of light. The device may be tuned without having to change the physical dimensions of the material and without use of liquid or gaseous substances infiltrated into the PBG device.

Figure 3:
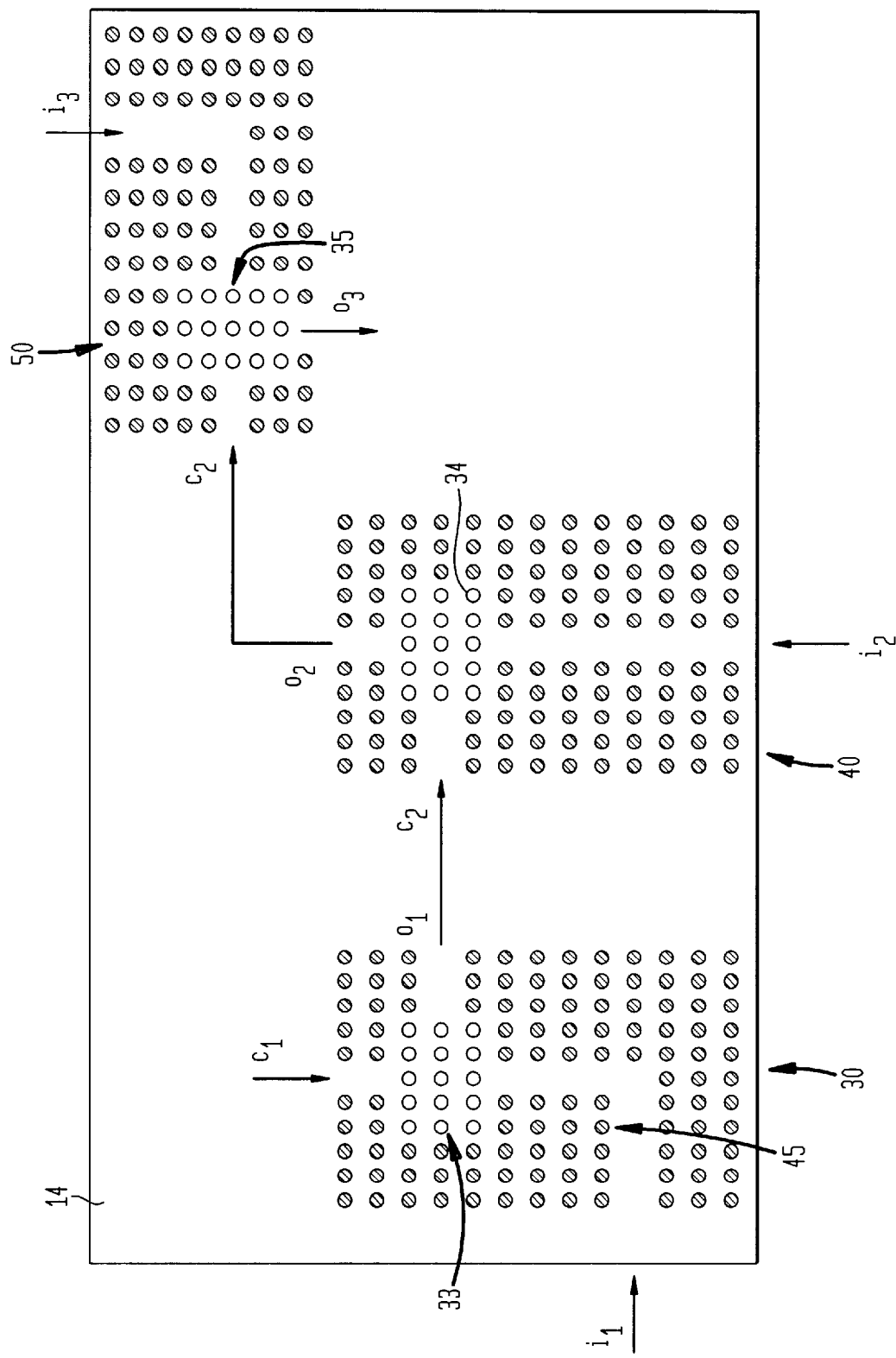
FIG. 3 is a schematic cross-sectional view of an integrated circuit device comprising an array of transistors according to FIG. 2.

The photonic band-gap device of this invention advantageously may be used in a variety of applications including optical fiber communications and integrated circuit devices. Referring to FIG. 3, a photonic circuit application is shown comprising a PBG integrated circuit device. This integrated circuit device has been formed by connecting signals from a plurality of PBG transistors according to FIG. 2, i.e., three transistors 30, 40, and 50 are shown formed in a single substrate 14. A control signal $C_1$ is applied to a photoresponsive region 33 along the light propagation path 45 to modify the output signal $O_1$ generated from the first device 30. This output signal operates as the control signal $C_2$ for the second device, which is applied to photoresponsive region 34 of the second device. The second device also receives a second input signal $I_2$. The output signal generated from the second device $O_2$ (controlled by the output signal $O_1$ of the first device), in turn is applied to photoresponsive region 35 to control the output $O_3$ generated by the third device 50. With this inventive circuit device, digital or analog computational functions may be performed. The behavior of the light in photonic crystals can be calculated applying the envelope-function approximation as detailed in J. P. Mattia, "Simple Application of the Envelope—Function Approximation for Photonic Crystals," PHYSICAL REVIEW B., Vol. 57, No. 3 (1998), p. 1308, which is hereby incorporated by reference.

Figure 4:
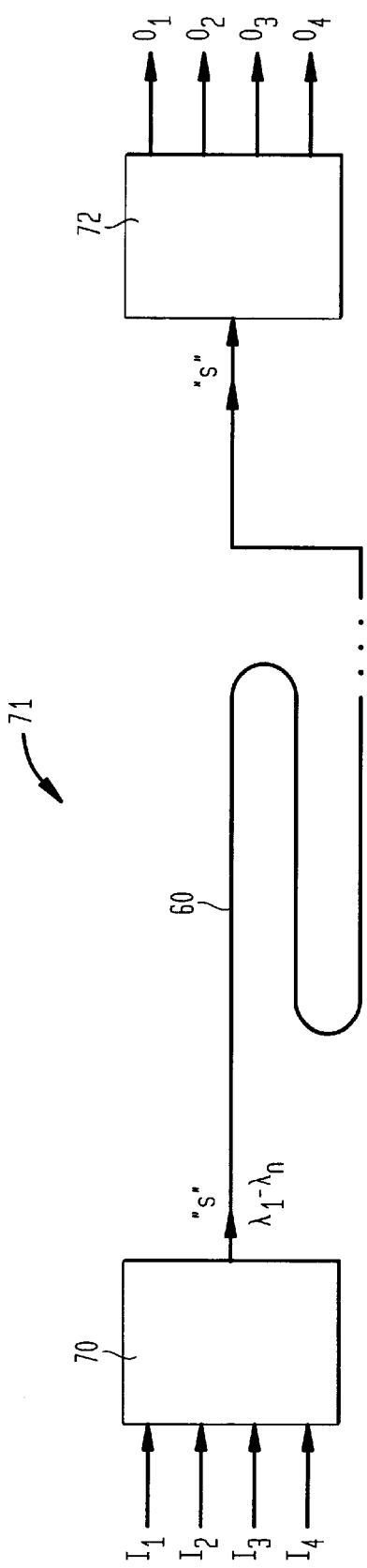
FIG. 4 is a schematic view of a communications system illustrating a potential application of the inventive device.

FIG. 4 schematically illustrates a communications system comprising an improved transmitter 70, an N-channel multiplexer/demultiplexer 71, and a receiver 72, all connected by trunk fiber 60. The input to the fiber 60 from the source 70 consists of an optical signal "S" which may include light at several wavelengths, $\lambda_1$ to $\lambda_n$. The improved transmitter for a single wavelength may comprise a PBG device 70 according to the invention so that a plurality of input signals $I_1, I_2, I_3, I_4$, may be combined to a higher-speed optical signal "S" input to the trunk fiber 60. Conversely, the receiver 72 may comprise a PBG device according to the invention so that a high-speed optical signal "S" may be modified to slower-speed output signals $O_1, O_2, O_3, O_4$.

It is understood that the embodiments described herein are merely exemplary and that a person skilled in the art may make variations and modifications without departing from the spirit and scope of the invention. All such variations and modifications are intended to be included within the scope of the appended claims.

I claim:

1. An article including a photonic band-gap device adapted for substantially preventing electromagnetic radiation having one or more select wavelengths from propagating within the device, the photonic-band gap device comprising a substrate having a light propogation path therein, and a photoresponsive region disposed within a portion of the light propogation path in the substrate so that the wavelength of radiation propogated alone the light propogation path may be controllably modified by applying light to the photoresponsive region to define a tunable photonic band-gap device.

2. The article of claim 1, in which the photoresponsive region is fabricated with photorefractive material.

3. The article of claim 1, in which the photoresponsive region is fabricated with photoabsorptive material.

4. The article of claim 1, in which the photoresponsive region comprises a plurality of quantum well regions.

5. The article of claim 1, in which the substrate comprises a semiconductor wafer.

6. The article of claim 1 in which the photonic band gap device may be tuned without having to physically change the device dimensions.

7. An article including a photonic band-gap device for substantially preventing electromagnetic radiation having one or more wavelengths from propagating within the device, the photonic-band gap device comprising a substrate and a photoresponsive region disposed in the substrate so that the behavior of the photonic band-gap device in substantially preventing the propagation of radiation may be modified by applying light to the photoresponsive region, in which the photoresponsive region comprises a plurality of rods of photoresponsive materials disposed in the substrate.

8. The article of claim 7, in which the substrate of the device is fabricated with a material having a first dielectric constant and further comprising a plurality of dielectric regions disposed in the substrate, the dielectric regions being fabricated with a material having a dielectric constant different than the first dielectric constant.

9. The article of claim 8, in which the substrate has a plurality of holes therein to define voids.

10. The article of claim 9, in which the voids define a light propagation path for the routing of a light signal through the structure, the light propagation path comprising an input signal path, an output signal path, and a control signal path, in which the input signal path merges with the control signal path at a common intersection point to be joined with the output signal path, and the photoresponsive rods are disposed within the light propagation path at the common intersection point.

11. The article of claim 10 comprising a transistor.

12. An integrated circuit device comprising a plurality of transistors according to claim 11.

13. The integrated circuit device of claim 12, in which the substrate comprises a semiconductor wafer and the plurality of transistors are defined in the semiconductor wafer.

14. A communications system comprising a transmitter, an N-channel multiplexer/demultiplexer, and a receiver connected by a trunk optical fiber, in which at least one of the transmitter and the receiver comprises a photonic band-gap device for substantially preventing electromagnetic radiation having one or more wavelengths from propagating within the device, the photonic-band gap device comprising a substrate and a photoresponsive region disposed in the substrate so that the behavior of the photonic band-gap device in substantially preventing the propagation of radiation may be modified by applying light to the photoresponsive region.

15. A photonic band-gap transistor comprising:
a substrate;
a plurality of dielectric rods and a plurality of photoresponsive rods arranged in a matrix in the substrate, and
a light propagation path defined in the substrate by the arrangement of the plurality of dielectric rods for the routing of a light signal through the structure from an inlet to an outlet, the light propagation path comprising an input signal path beginning at the inlet, an output signal path ending at the outlet, and a control signal path, in which the input signal path and the control signal path merge at a common intersection point to be joined with the output signal path, and the photoresponsive rods are disposed within the light propagation path at the common intersection point, whereby as the signal is routed through the photonic band-gap transistor along the light propagation path from the inlet to the outlet, a control signal may be selectively passed through the control signal path to the photoresponsive rods to alter the optical properties of the photoresponsive rods and thereby change the signal generated by the photonic band-gap transistor at the outlet.

16. The transistor according to claim 15, in which the plurality of dielectric rods comprise first dielectric rods and second dielectric rods, the first dielectric rods having a different dielectric constant than the second dielectric rods, and the light propagation path is defined by the arrangement of the first and second dielectric rods.

17. The transistor according to claim 15, in which along a predetermined path within the substrate there is an absence of dielectric rods, and the light propagation path is defined by the absence of dielectric rods.

18. An integrated circuit device comprising a plurality of transistors according to claim 15.

19. A method for modifying the photonic bandgap behavior of a photonic band-gap device comprising the steps of:
(a) providing a photonic band-gap device for substantially preventing electromagnetic radiation having one or more wavelengths from propagating within the device, the photonic-band gap device comprising a substrate and a photoresponsive region disposed in the substrate so that the behavior of the photonic band-gap device in substantially preventing the propagation of radiation may be modified by applying light to the photoresponsive region;

and (b) applying light to the device to alter the optical properties of the photoresponsive region.

* * * * *